(12) United States Patent
Oka et al.

(10) Patent No.: US 7,585,688 B2
(45) Date of Patent: Sep. 8, 2009

(54) METHOD FOR MANUFACTURING SEMICONDUCTOR OPTICAL DEVICE

(75) Inventors: Takafumi Oka, Tokyo (JP); Shinji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 34 days.

(21) Appl. No.: 12/039,267

(22) Filed: Feb. 28, 2008

(65) Prior Publication Data

US 2008/0293176 A1 Nov. 27, 2008

(30) Foreign Application Priority Data

Mar. 29, 2007 (JP) ............... 2007-088771

(51) Int. Cl.
*H01L 21/00* (2006.01)
(52) U.S. Cl. ............... 438/31; 438/39; 257/98; 257/E33.067
(58) Field of Classification Search ............... 438/31, 438/39, 42; 257/98, E33.067; 385/131, 132
See application file for complete search history.

(56) References Cited

U.S. PATENT DOCUMENTS

| | | | |
|---|---|---|---|
| 6,171,876 B1 | 1/2001 | Yuang et al. | |
| 6,335,215 B1* | 1/2002 | Yuang | ............... 438/31 |
| 6,335,216 B1* | 1/2002 | Yoshida et al. | ............... 438/40 |
| 6,784,010 B2 | 8/2004 | Yamaguchi et al. | |
| 7,123,639 B2 | 10/2006 | Kawahara | |
| 7,177,336 B2 | 2/2007 | Taneya et al. | |
| 7,208,338 B2 | 4/2007 | Chiba et al. | |
| 7,456,039 B1* | 11/2008 | Kawasaki et al. | ............... 438/31 |
| 2002/0153528 A1 | 10/2002 | Yamaguchi et al. | |
| 2008/0020502 A1* | 1/2008 | Shiga et al. | ............... 438/31 |
| 2008/0029777 A1* | 2/2008 | Shiga | ............... 257/98 |
| 2008/0090315 A1* | 4/2008 | Abe et al. | ............... 438/31 |
| 2008/0233668 A1* | 9/2008 | Abe | ............... 438/31 |

FOREIGN PATENT DOCUMENTS

| | | |
|---|---|---|
| JP | 02-205319 | 8/1990 |
| JP | 2000-12970 | 1/2000 |
| JP | 2000-22261 | 1/2000 |
| JP | 2000-114664 | 4/2000 |
| JP | 2000-164987 | 6/2000 |
| JP | 2000-340880 | 12/2000 |
| JP | 2002-171028 | 6/2002 |
| JP | 2002-208753 | 7/2002 |
| JP | 2002-335048 | 11/2002 |

(Continued)

*Primary Examiner*—Tuan N. Quach
(74) *Attorney, Agent, or Firm*—Leydig, Voit & Mayer, Ltd.

(57) ABSTRACT

A method for manufacturing a semiconductor optical device includes: forming a first resist pattern on a top surface of a laminated semiconductor structure; forming channels and a waveguide ridge by dry etching using the first resist pattern as a mask; forming an $SiO_2$ film on the waveguide ridge and the channels, leaving the first resist pattern on a top surface of the waveguide ridge; forming a second resist pattern covering the $SiO_2$ film on the channels, and exposing the top surface of the $SiO_2$ film on top of the waveguide ridge; removing the $SiO_2$ film by dry etching using the second resist pattern as a mask; removing the first and second resist patterns by a wet method; and forming a p-side electrode.

4 Claims, 6 Drawing Sheets

FOREIGN PATENT DOCUMENTS

| | | |
|---|---|---|
| JP | 2003-142769 | 5/2003 |
| JP | 2004-253545 | 9/2004 |
| JP | 2005-033021 | 2/2005 |
| JP | 2005-183621 | 7/2005 |
| JP | 2006-148065 | 6/2006 |
| WO | WO 03/085790 A1 | 10/2003 |

\* cited by examiner

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more particularly to a method for manufacturing a semiconductor optical device in which the waveguide ridge has an electrode on its top.

2. Description of the Related Art

There has been a need for emission of light in the blue to ultraviolet wavelength range to enhance the recording density of optical discs. In order to meet such a need, intense R&D effort has recently been carried out to develop nitride semiconductor lasers formed of a Group III-V nitride compound semiconductor such as AlGaInN. Some of them have already been practically used.

Such blue-violet laser diodes (hereinafter referred to as "blue-violet LDs") are formed by growing a compound semiconductor in crystal form on a GaN substrate.

A representative compound semiconductor is the Group III-V compound semiconductor, in which Group III and V elements are combined together. Mixed crystal III-V compound semiconductors having different compositions can be formed by bonding pluralities of Group III atoms and Group V atoms in different manners. Examples of compound semiconductors used to form a blue-violet LD include GaN, GaPN, GaNAs, InGaN, and AlGaN.

In ridge waveguide LDs, an electrode layer is usually provided on top of the waveguide ridge. This electrode layer is connected to the contact layer (i.e., the top layer of the waveguide ridge) through an opening formed in the insulating film covering the top portion of the waveguide ridge. This insulating film with the above opening is formed by lift-off using the same resist mask that was used to form the waveguide ridge. However, since the surface of the resist mask in contact with the contact layer is concavely curved with respect to the surface of the contact layer, part of the material used to form the insulating film covering the waveguide ridge remains in this concave portion and hence partly covers the surface of the contact layer even after the lift-off process, resulting in a reduction in the contact area between the electrode layer and the contact layer. (That is, the contact area is smaller than the top surface area of the contact layer.)

In the case of a red LD, this reduction in the contact area between the electrode layer and the contact layer due to the lift-off process does not significantly increase the contact resistance and hence the operating voltage of the LD, since the material used to form the contact layer (e.g., GaAs, etc.) has a relatively low contact resistance.

In the case of a blue-violet LD, on the other hand, the material used to form the contact layer is GaN, etc. having a relatively high contact resistance. Therefore, a reduction in the contact area between the electrode and the contract layer results in an increase in the contact resistance between them, thereby increasing the operating voltage of the blue-violet LD.

There will now be described several known methods for manufacturing an LD in such way as to prevent a reduction in the contact area between the electrode and the contact layer.

A first method forms a nitride semiconductor laser device in the following manner. First, a p-type electrode layer of palladium/molybdenum/gold is formed on a p-type contact layer which is the top layer of the semi-conductor layer stack formed on a wafer. A resist mask (not shown) having a stripe shape is then formed on the p-type electrode layer and used to form a ridge stripe by RIE (Reactive Ion Etching). More specifically, the p-type electrode is formed by etching using Ar gas, and then the p-type contact layer and the p-type cladding layer, or these layers and the p-guiding layer, are etched by a mixed gas composed of Ar, $Cl_2$, and $SiCl_4$ to form the ridge stripe. (The etching is stopped at a depth halfway through the p-type cladding layer or the p-guiding layer.) Next, an insulating film (of Zr oxide predominantly including $ZrO_2$) having a thickness of 0.5 µm is formed over the surface of the wafer, with the ridge strip still leaving the resist thereon. The resist is then removed to expose the top surface of the ridge stripe. Further, a p-type pad electrode of molybdenum and gold is formed to cover the p-type electrode and at least the portions of the insulating film on both sides of the p-type electrode. (See, e.g., Japanese Domestic Republication of International Patent Application No. WO 2003/085790, lines 42-50 on page 9, FIG. 1.)

A second known method is a self-aligning method for manufacturing a ridge waveguide semiconductor LD and includes the step of forming two different photoresist layers one on top of the other, as described below.

The lower photoresist layer is only sensitive to light of wavelengths shorter than 300 nm, while the upper photoresist layer is only sensitive to light of wavelengths longer than 300 nm. Specifically, this self-aligning method is applied to a laminated semiconductor structure that includes a second cladding waveguide layer and a capping layer formed on the second cladding waveguide layer. The method begins by removing portions of the capping layer and the second cladding waveguide layer to form a ridge structure and a double channel. A second insulating film is then formed on the surfaces of the ridge structure and the double channel. A first photoresist layer (the lower photoresist layer) is then formed on the second insulating film, and a second photoresist layer (the upper photoresist layer) is formed on the first photoresist layer. Next, the second photoresist layer is patterned to expose the portions of the first photoresist layer around the ridge structure. Further, the first photoresist layer is processed by an RIE process to expose the portion of the second insulating film on the ridge structure. The portions of the second insulating film around the ridge structure are then removed by an etching process including an RIE process. The remaining portions of the first and second photoresist layers are then removed, and a first metal layer is deposited as an electrode. (See, e.g., Japanese Laid-Open Patent Publication No. 2000-22261, paragraphs 0024 to 0034, FIGS. 7 to 18.)

A third known method first forms a ridge and channels by wet etching the contact layer using a metal mask of Al and then wet etching the underlying layer using as a mask this contact layer with the metal mask still thereon. Next, an insulating film is formed over the entire surface of the substrate by plasma CVD, and the Al pattern (the metal mask) and the overlying portions of the insulating film are removed by lift-off. A resist pattern is then formed by a common lithographic process. (This resist pattern exposes the portion of the surface where a p-type electrode is subsequently formed.) A layer of electrode material is then formed by vacuum deposition using the resist pattern as a mask, and subsequently the resist pattern and the overlying portion of the electrode material layer are removed by lift-off to form the electrode in close contact with the contact layer of the ridge. (See, e.g., Japanese Laid-Open Patent Publication No. 2000-340880, paragraphs 0025 to 0034, FIG. 1.)

A fourth known method proceeds as follows. A first protective film is formed over substantially the entire surface of the contact layer, and a third protective film having a stripe shape is formed on the first protective film. Then, after etching the first protective film with the third protective film thereon, the third protective film is removed. (This step processes the first protective film into a stripe shape.) The p-side contact layer is then etched through its entire thickness and the underlying layer (for example, a p-side cladding layer) is etched halfway through its thickness to form a waveguide having a stripe shape. Next, a second protective film (which has electrically insulating properties and is made of a different material than the first protective film) is formed on the sides of the stripe-shaped waveguide and on the top surface of the nitride semiconductor layer (i.e., the p-side cladding layer) exposed by the above etching process. The first protective film is then removed by lift-off, and a p-electrode is formed on the second protective film and the p-side contact layer such that the p-electrode is electrically connected to the p-side contact layer. (See, e.g., Japanese Laid-Open Patent Publication No. 2003-142769, paragraphs 0020 to 0027, FIG. 1.)

The above conventional methods provide a sufficient contact area between the contact layer of the waveguide ridge and the electrode layer. However, these methods are disadvantageous in that it is difficult to reliably manufacture devices having substantially equal characteristics, since they include the step of: etching a metal film and the underlying semiconductor layer at the same time; etching the lower of two laminated resist layers to a predetermined controlled depth; or forming an electrode by lift-off after forming a metal film mask or a plurality of protective films. Further, employing a plurality of resists or protective films results in reduced freedom in process design.

In order to overcome the above problems, a method has been proposed for manufacturing a semiconductor optical device in such a way as to reliably prevent a reduction in the contact area between the top semiconductor layer (or contact layer) of the waveguide ridge and the overlying electrode layer by employing a simple process.

This method proceeds as follows. Channels are formed in a wafer having a semiconductor layer stack formed thereon, thereby forming a waveguide ridge. An $SiO_2$ film is then formed over the entire surface of the wafer. A resist is then applied over the entire surface of the wafer to form a resist film having a greater thickness on the channels than on the top of the waveguide ridge. Next, material is uniformly removed from the surface of the resist film so that the film is completely removed from on top of the waveguide ridge but left in the channels, thereby forming a resist pattern that exposes the top of the waveguide ridge. The exposed surface of the $SiO_2$ film is then uniformly etched using the resist pattern as a mask so that the film is completely removed from on top of the waveguide ridge but left on the sides and bottoms of the channels. The remaining portion of the $SiO_2$ film has an opening that exposes the top of the waveguide ridge.

Then, after removing the resist pattern, a p-side electrode is formed on the top of the waveguide ridge.

Several known processes for forming a ridge will now be described. A first known process forms a ridge stripe using a p-type ohmic electrode as a mask in the following manner. First, a stripe-shaped metal layer stack (including a first layer of Ni/Au and a second layer of Pt) is formed on the top surface of the p-contact layer of GaN. The wafer is then heat treated to alloy these metal layers to form the p-side ohmic electrode. Next, the wafer is etched in an etching gas of $Cl_2$ using the p-side ohmic electrode as a mask until the p-type guiding layer is exposed. (See, e.g., Japanese Laid-Open Patent Publication No. 2004-253545, paragraphs 0035 to 0038, FIG. 2.)

A second known process for forming a ridge proceeds as follows.

At a first step, a first protective film of an Si oxide is formed over substantially the entire surface of the p-side contact layer, and a stripe-shaped third protective film is formed on the first protective film. The first protective film with the third protective film thereon is then etched into a stripe shape before removing the third protective film.

At a second step, the portions of the p-side contact layer and the p-side cladding layer not underlying the first protective film are etched (without etching the first protective film) to form a stripe-shaped waveguide region under the first protective film. (Naturally, this waveguide region has a shape corresponding to the shape of the first protective film.)

At a third step, a second protective film (which has electrically insulating properties and which is made of a different material than the first protective film) is formed on the sides of the stripe-shaped waveguide, on the etched and exposed top surface of the nitride semiconductor layer (i.e., the p-side cladding layer), and on the first protective film. The first protective film and the overlying portion of the second protective film are then removed by etching, leaving the second protective film on the sides of the stripe (or waveguide) and the top surface of the p-side cladding layer. (The remaining portion of the second protective film continuously extends from the sides of the stripe to the top surface of the p-side cladding layer.)

The etching at the above third step may be, but is not limited to, dry etching in hydrofluoric acid. (See, e.g., Japanese Laid-Open Patent Publication No. 2000-114664, paragraphs 0018 to 0024, FIG. 6.)

A third known process for forming a ridge proceeds as follows.

First, layers of GaN-based material are epitaxially grown on a sapphire substrate, and a first $SiO_2$ film (a first mask) having a stripe shape is formed on the top layer (a p-GaN contact layer). Dry etching is then performed using the first $SiO_2$ film as a mask to form a ridge stripe.

Next, an AlGaN burying layer is uniformly formed on both sides of the ridge stripe and on the first $SiO_2$ film, and a second $SiO_2$ film (a second mask) is formed on the AlGaN burying layer. A resist film is then formed on the second $SiO_2$ film by spin coating such that the resist film has a smaller thickness on the top of the ridge stripe than on both sides of the ridge stripe. The portion of the resist film above the top of the ridge stripe is removed by dry etching in oxygen gas, etc. to expose the second $SiO_2$ film (or second mask). Subsequently, the exposed portion of the second $SiO_2$ film is selectively etched using $CF_4$ to expose the AlGaN burying layer. The remaining resist film is then removed by ashing to expose the underlying second $SiO_2$ film. The AlGaN burying layer is then partially removed by wet etching using the second $SiO_2$ film as a mask to expose the first $SiO_2$ film (or first mask) on the top of the ridge stripe. Lastly, the first $SiO_2$ film (or first mask) and the remaining second $SiO_2$ film (or second mask) are removed by wet etching. (See, e.g., Japanese Laid-Open Patent Publication No. 2000-164987, paragraphs 0030 to 0040, FIGS. 2 to 12.)

Further, a fourth known process for forming a ridge proceeds as follows.

First, a laminated structure of GaN-based material is formed on a sapphire substrate by MOCVD, etc., and a stripe-shaped second electrode is formed on the second contact layer of the laminated structure. A ridge structure is then formed using this second electrode as a mask. Next, an $SiO_2$ insulating film is formed to entirely cover the ridge structure and the second cladding layer on both sides of the ridge structure (the ridge structure including the second electrode, the second contact layer, and a portion of the second cladding layer). A resist film is then applied over this insulating film such that the resist film has a smaller thickness on the ridge structure than on the second cladding layer on both sides of the ridge structure. (The top surface of the resist film is substantially flat and level.) Etching is then performed to expose the top surface and both sides of the second electrode and the upper portions of both sides of the second contact layer and thereby form a stripe-shaped metal film having a width corresponding to the width of the mesa structure. (See, e.g., Japanese Laid-Open Patent Publication No. 2002-335048, paragraphs 0064 to 0073, FIGS. 3 to 6.)

Thus, conventional methods for manufacturing an optical semiconductor device include the following steps: channels are formed in a wafer having a semiconductor layer stack formed thereon, thereby forming a waveguide ridge; an $SiO_2$ film is formed over the entire surface of the wafer; a resist is applied over the $SiO_2$ film to form a resist film; a material is removed from the surface of the resist film so that the film is completely removed from on top of the waveguide but left in the channels, thereby forming a resist pattern that exposes the top of the waveguide ridge; and the exposed surface of the $SiO_2$ film is uniformly etched using the resist pattern as a mask so that the $SiO_2$ film is completely removed from on top of the waveguide ridge but left on the sides and bottoms of the channels (that is, the remaining portion of the $SiO_2$ film has an opening that exposes the top of the waveguide ridge). In the above last step, if dry etching is used to remove the $SiO_2$ film from on top of the waveguide ridge, the semiconductor layer underlying the $SiO_2$ film may be damaged. For example, when the underlying semiconductor layer is a p-type contact layer, it may be damaged by the etching process, resulting in an increased contact resistance. Especially, if the p-type contact layer is made of a GaN-based material, the damaged portion(s) is difficult to remove by wet etching, since it is difficult to remove material from a GaN-based material surface by wet etching.

SUMMARY OF THE INVENTION

The present invention has been devised to solve the above problems. It is, therefore, a primary object of the present invention to provide a method for manufacturing a semiconductor optical device with a high yield and in such a way as to reliably prevent a reduction in the contact area between the top semiconductor layer of the waveguide ridge and the overlying electrode layer and prevent damage to the top semiconductor layer due to etching by employing a simple process.

According to one aspect of the present invention, there is provided a method for manufacturing a semiconductor optical device comprising: forming, in a photolithography process, a first resist pattern of a resist film disposed on a top surface of a laminated semiconductor structure including a first semiconductor layer of a first conductivity type, an active layer, and a second semiconductor layer of a second conductivity type, in sequence, on a substrate, the first resist pattern having a portion shaped in correspondence to a waveguide ridge; removing upper portions of the second semiconductor layer by dry etching, using the first resist pattern as a mask, to form the waveguide ridge and concave portions adjacent to the waveguide ridge, concave portions leaving lower portions of the second semiconductor layer; forming a first insulating film on the waveguide ridge and on the concave portions, leaving the first resist pattern still on a top surface of the waveguide ridge; forming a second resist pattern covering the first insulating film in the concave portions, and exposing a top surface of the first insulating film on top of the waveguide ridge, the second resist pattern having a top surface closer to the substrate than a top surface of the first resist pattern on the waveguide ridge or leveling with a top surface of the first resist pattern on the waveguide ridge; removing the first insulating film by etching, using the second resist pattern as a mask, to expose a top surface of the first resist pattern leaving on the waveguide ridge; removing the first resist pattern on top of the waveguide ridge and the second resist pattern; and forming an electrode layer on the top surface of the second semiconductor layer in the waveguide ridge.

Accordingly, the method of the present invention for manufacturing a semiconductor optical device includes forming a first insulating film on the waveguide ridge leaving the first resist pattern still on a top surface of the waveguide ridge, removing the first insulating film by etching, using the second resist pattern as a mask, to expose a top surface of the first resist pattern leaving on the waveguide ridge, and removing the first resist pattern on top of the waveguide ridge and the second resist pattern.

This arrangement allows the electrode layer to be formed on and in full contact with the second semiconductor layer while avoiding a reduction in the contact area between them.

Further, even if the first insulating film is removed by dry etching, the first resist pattern that covers the top surface of the waveguide ridge protects the surface of the second semiconductor layer from damage due to such etching, thereby preventing an increase in the contact resistance between the second semiconductor layer and the electrode layer formed later in the process. As a result, it is possible to manufacture a semiconductor optical device having good characteristics with a high yield by employing a simple process.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While preferred embodiments of the present invention will be described with reference to blue-violet LDs (a type of semiconductor optical device), it is to be understood that the invention is not limited to blue-violet LDs. The present invention can be applied to any semiconductor optical device such as a red LD, with the same effect.

First Embodiment

Figure 1:
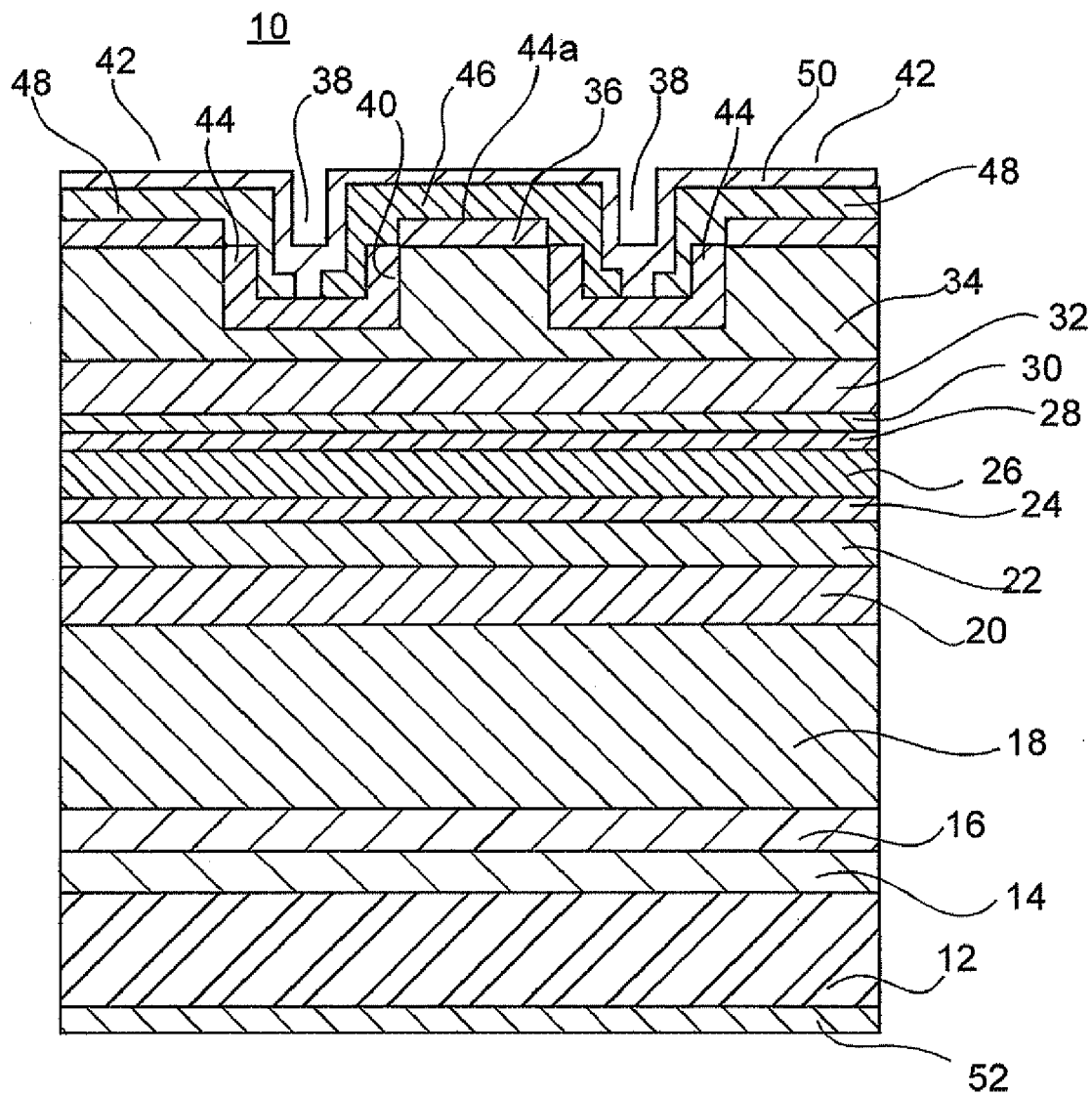
FIG. 1 is a cross-sectional view of an LD according to one embodiment of the present invention.

FIG. 1 is a cross-sectional view of an LD according to one embodiment of the present invention. It should be noted that in the figures, like numerals are used to denote like or corresponding components.

Referring to FIG. 1, the LD 10 is a ridge waveguide blue-violet LD in which the following layers are sequentially formed on top of one another on one principal surface (a Ga surface) of an n-type GaN substrate 12 (n-type, p-type, and i-type (undoped) being hereinafter abbreviated as "n-," "p-," and "i-," respectively): a buffer layer 14 of n-GaN; a first n-cladding layer 16 of n-AlGaN formed on the buffer layer 14; a second n-cladding layer 18 of n-AlGaN formed on the first n-cladding layer 16; a third n-cladding layer 20 of n-AlGaN formed on the second n-cladding layer 18; an n-side light guiding layer 22 of n-GaN formed on the third n-cladding layer 20; an n-side SCH (Separate Confinement Heterostructure) layer 24 of InGaN; and an active layer 26. It should be noted that, for example, the first to third n-cladding layers 16, 18, 20 constitute a first semiconductor layer according to the present embodiment.

Further, the following layers are sequentially formed on top of one another on the active layer 26: a p-side SCH layer 28 of InGaN; an electron barrier layer 30 of p-AlGaN; a p-side light guiding layer 32 of p-GaN; a p-cladding layer 34 of p-AlGaN; and a contact layer 36 of p-GaN. According to the present embodiment, the p-cladding layer 34 and the contact layer 36, for example, constitute a second semiconductor layer. In other embodiments, however, only one layer, or three or more layers, may constitute the second semiconductor layer.

Channels 38 serving as concave portions are formed in the contact layer 36 and the p-cladding layer 34. As a result, the contact layer 36 and the portion of the p-cladding layer 34 in contact with the contact layer 36 form a waveguide ridge 40.

The waveguide ridge 40 is located in a center portion of the width of the cleaved end faces (or resonator end faces) of the LD 10 and extends between these end faces. The longitudinal dimension of the waveguide ridge 40, that is, the resonator length, is, for example, 1000 μm, and the ridge width perpendicular to the longitudinal direction is one to a few tens of microns. (The present embodiment assumes this width to be 1.5 μm.)

Further according to the present embodiment, the width of the channels 38 is 10 μm. The raised platform portions on both sides of the waveguide ridge 40 with the channels 38 therebetween are referred to herein as the "electrode pad platforms 42."

The height of the waveguide ridge 40 measured from the bottom surface of the channels 38 is, for example, 0.5 μm.

A first silicon oxide film 44 serving as a first insulating film covers both sides of the channels 38 (i.e., the sidewalls of the waveguide ridge 40 and the sidewalls of the electrode pad platforms 42) and the bottom surfaces of the channels 38. The top edges of the first silicon oxide film 44 that covers the sides of the channels 38 are substantially level with the lower surface of the contact layer 36.

The first silicon oxide film 44 is made up of, for example, an $SiO_2$ film having a thickness of 200 nm. The first silicon oxide film 44 does not cover the top surface of the contact layer 36 of the waveguide ridge 40; it has an opening 44a that exposes the entire top surface and both sides of the contact layer 36.

A p-side electrode 46 is disposed on and electrically coupled to the top surface of the contact layer 36. The p-side electrode 46 is formed by sequentially depositing gold-gallium (AuGa), gold (Au), platinum (Pt), and Au layers by vacuum deposition. It closely covers the top surface and both sides of the contact layer 36 and extends to cover the top edges of the first silicon oxide film 44 and also cover the first silicon oxide film 44 on the sidewalls of the waveguide ridge 40 and on portions of the bottom surfaces of the channels 38.

Further, a second silicon oxide film 48 formed, for example, of $SiO_2$ covers the top surfaces of the electrode pad platforms 42 and also covers the first silicon oxide film 44 on the sides of the electrode pad platforms 42 (within channels 38) and on portions of the bottom surfaces of the channels 38.

A pad electrode 50 is disposed on and in close contact with the top surface of the p-side electrode 46. It extends to cover the p-side electrode 46, the first silicon oxide film 44, and the second silicon oxide film 48 within the channels 38 on both sides of the waveguide ridge 40 and also cover the second silicon oxide film 48 on the top surfaces of the electrode pad platforms 42.

Further, an n-side electrode 52 is disposed on the bottom surface of the n-GaN substrate 12. The n-side electrode 52 is formed by sequentially depositing Ti, Pt, and Au films by vacuum deposition.

This LD 10 is doped with silicon (Si) and magnesium (Mg), which act as n-type and p-type impurities, respectively.

The n-GaN substrate 12 has a thickness of approximately 500-700 μm, and the buffer layer 14 has a thickness of approximately 1 μm. The first n-cladding layer 16 has a thickness of approximately 400 nm and is formed, for example, of n-$Al_{0.07}Ga_{0.93}N$. The second n-cladding layer 18 has a thickness of approximately 1000 nm and is formed, for example, of n-$Al_{0.045}Ga_{0.955}N$. The third n-cladding layer 20 has a thickness of approximately 300 nm and is formed, for example, of n-$Al_{0.015}Ga_{0.985}N$.

The n-side light guiding layer 22 has a thickness of, for example, 80 nm. The n-side SCH layer 24 has a thickness of 30 nm and is formed of i-$In_{0.02}Ga_{0.98}N$.

The active layer 26 has a double quantum well structure made up of a well layer 26a (not shown) of i-$In_{0.12}Ga_{0.88}N$ having a thickness of 5 nm, a barrier layer 26b (not shown) of i-$In_{0.02}Ga_{0.98}N$ having a thickness of 8 nm, and a well layer 26c (not shown) of i-$In_{0.12}Ga_{0.88}N$ having a thickness of 5 nm. The well layer 26a is disposed on and in contact with the n-side SCH layer 24, the barrier layer 26b is disposed on the well layer 26a, and the well layer 26c is disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of approximately 20 nm and is formed of p-$Al_{0.2}Ga_{0.8}N$. The p-side light guiding layer 32 has a thickness of 100 nm, and the p-cladding layer 34 has a thickness of approximately 500 nm and is formed of p-$Al_{0.07}Ga_{0.93}N$. The contact layer 36 has a thickness of 20 nm.

There will now be described a method for manufacturing the LD 10.

FIGS. 2 to 12 are partial cross-sectional views illustrating process steps in a method for manufacturing an LD according to the present invention.

This method first forms a laminated semiconductor structure (configured as described above) on the n-GaN substrate 12. It should be noted that FIGS. 2 to 12 do not show the electron barrier layer 30 and the underlying layers including the n-GaN substrate 12, since these layers do not change in any substantial way in the process steps described below after they are formed. These figures only show a cross section of a portion of the p-side light guiding layer 32 and a cross section of each overlying layer.

Specifically, the method begins by providing a GaN substrate 12 whose surfaces have been cleaned by thermal cleaning, etc. An n-GaN layer (which is or will become the buffer layer 14) is then formed on the GaN substrate 12 by metalorganic chemical vapor deposition (MOCVD) at a growth temperature of, e.g., 1000° C.

Next, the following layers are sequentially formed on top of one another: an n-$Al_{0.07}Ga_{0.93}N$ layer (which is or will become the first n-cladding layer 16); an n-$Al_{0.045}Ga_{0.955}N$ layer (the second n-cladding layer 18); an n-$Al_{0.015}Ga_{0.985}N$ layer (the third n-cladding layer 20); an i-$In_{0.02}Ga_{0.98}N$ layer (the n-side light guiding layer 22); and an i-$In_{0.02}Ga_{0.98}N$ layer (the n-side SCH layer 24).

Further, an i-$In_{0.12}Ga_{0.88}N$ layer (which is or will become the well layer 26a), an i-$In_{0.02}Ga_{0.98}N$ layer (the barrier layer 26b), and an i-$In_{0.12}Ga_{0.88}N$ layer (the well layer 26c) are sequentially formed on top of one another on the n-side SCH layer 24. (The well layers 26a and 26c and the barrier layer 26b sandwiched therebetween form the active layer 26, as described above.)

Figure 2:
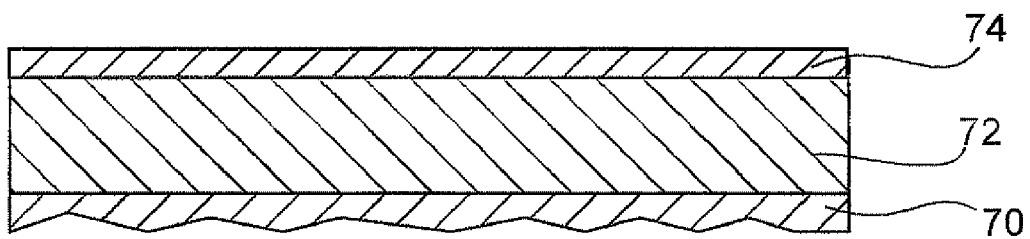
FIGS. 2 to 12 are partial cross-sectional views illustrating process steps in a method for manufacturing an LD according to the present invention.

Next, the following layers are sequentially formed on top of one another on the active layer 26: an i-$In_{0.02}Ga_{0.98}N$ layer (which is or will become the p-side SCH layer 28); a p-$Al_{0.2}Ga_{0.8}N$ layer (the electron barrier layer 30); a p-$Al_{0.2}Ga_{0.8}N$ layer 70 (the p-side light guiding layer 32); a p-$Al_{0.07}Ga_{0.93}N$ layer 72 (the p-cladding layer 34); and a p-GaN layer 74 (the contact layer 36). FIG. 2 shows the results of this process step.

Figure 3:
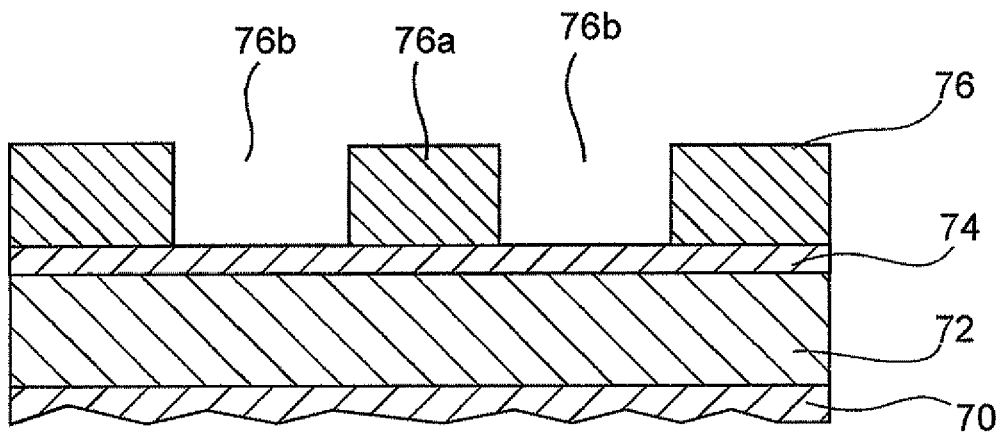

Referring now to FIG. 3, a resist is applied over the entire surface of the laminated semiconductor structure, and this resist is patterned into a resist pattern 76 serving as a first resist pattern by a photolithography process. The resist pattern 76 includes a portion 76a remaining in correspondence to the shape of the waveguide ridge 40 (formed later in the process) and cutout portions 76b corresponding to the shapes of the channels 38 (formed later in the process), as shown in FIG. 3. According to the present embodiment, the portion 76a corresponding to the shape of the waveguide ridge 40 has a width of, for example, 1.5 μm, and the cutout portions 76b corresponding to the shapes of the channels 38 have a width of 10 μm.

Figure 4:
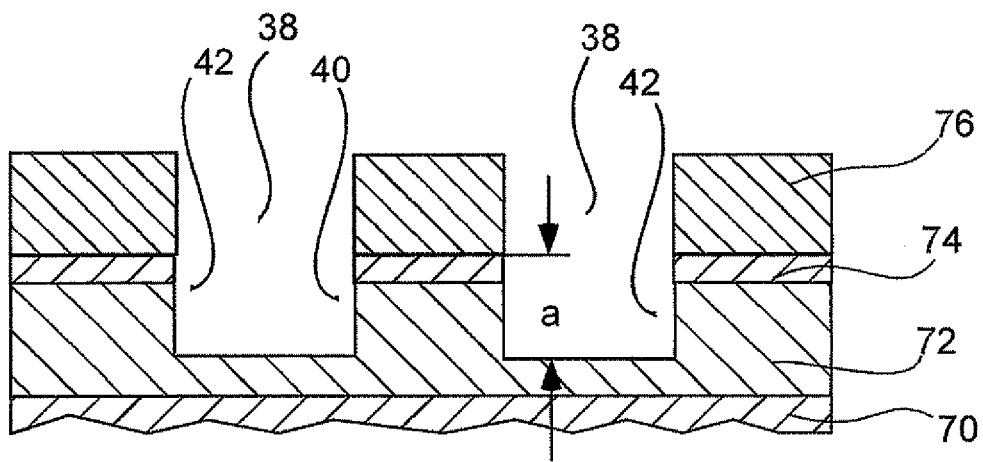

Referring now to FIG. 4, the p-GaN layer 74 is etched through its entire thickness and the p-$Al_{0.07}Ga_{0.93}N$ layer 72 is etched to a predetermined depth, for example, by RIE (Reactive Ion Etching) using the resist pattern 76 as a mask to form the channels 38 whose bottoms are defined by remaining portions of the p-$Al_{0.07}Ga_{0.93}N$ layer 72.

According to the present embodiment, the etch depth a is approximately 500 nm, or 0.5 μm (see FIG. 4).

Forming the channels 38 results in the formation of the waveguide ridge 40 and the electrode pad platforms 42, as shown in FIG. 4.

Figure 5:
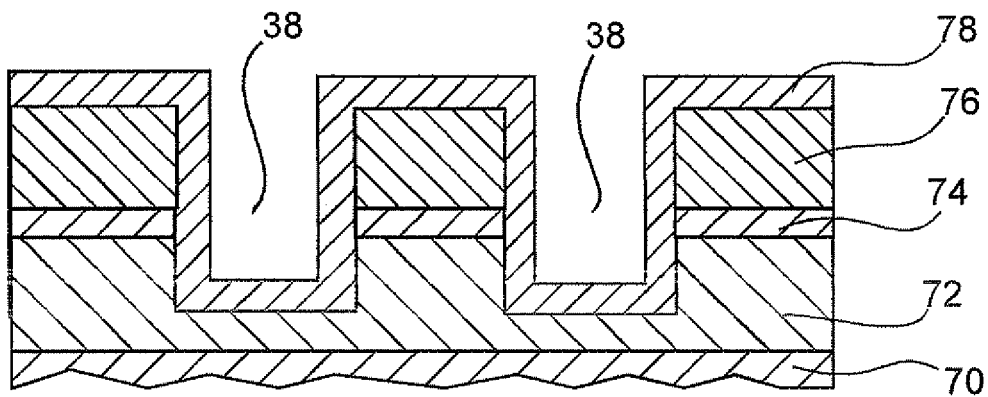

Referring now to FIG. 5, an $SiO_2$ film 78 (which will become the first silicon oxide film 44 serving as a first insulating film is formed over the entire surface of the n-GaN substrate 12 (or wafer) with the used resist pattern 76 still thereon by CVD, sputtering, etc. to a thickness of, e.g., 0.2 μm. The $SiO_2$ film 78 covers the top surface and sides of the resist pattern 76 on the top of the waveguide 40 and on the tops of the electrode pad platforms 42 and also covers the bottom and inner sides of the channels 38, as shown in FIG. 5.

It should be noted that instead of the $SiO_2$ film 78, one of the following insulating films may be formed: $SiO_x$ (0<x<2), SiN, SiON, $TiO_2$, $Ta_2O_5$, $Al_2O_3$, AlN, $ZrO_2$, $Nb_2O_5$, MgO, and SiC films.

Figure 6:
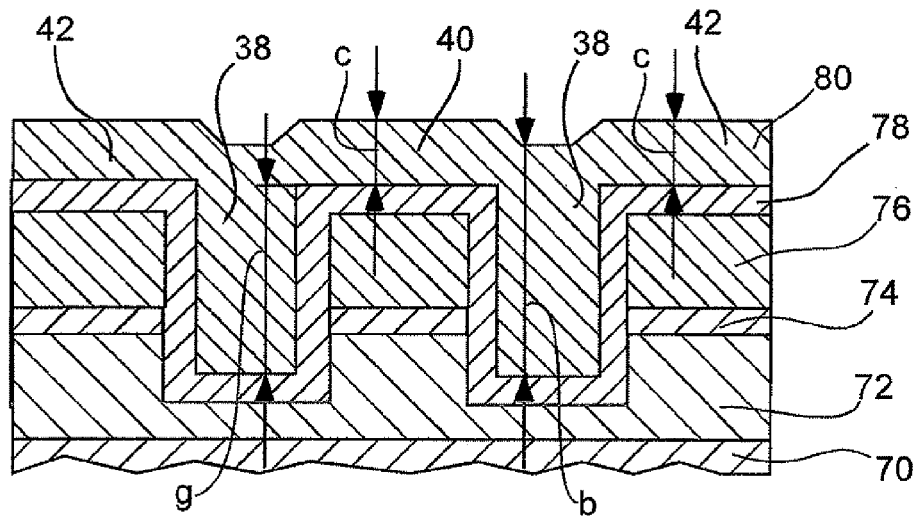

Referring now to FIG. 6, a photoresist is applied over the entire top surface of n-GaN substrate 12 (or wafer) to form a resist film 80 such that the thickness b of the resist film 80 on the channels 38 is greater than the thickness c of the resist film 80 on the top of the waveguide ridge 40 and on the tops of the electrode pad platforms 42. For example, the resist film 80 may be formed such that b=0.8 μm and c=0.4 μm.

Although in FIG. 6 the top surface of the resist film 80 is lower on the channels 38 than on the top of the waveguide ridge 40 and on the tops of the electrode pad platforms 42 (that is, the surface is concavely curved above the channels 38), it may be uniformly flat across the entire top surface of the resist film 80, which automatically ensures that b>c.

However, according to the present embodiment, the top surface of the resist film 80 may have any shape that ensures that b>c. That is, the top surface of the resist film 80 may be concavely curved above the channels 38, as in FIG. 6.

Generally, spin coating is used to apply a photoresist to a wafer (or substrate). That is, the resist is dropped onto the wafer, which is then rotated to form a film having a uniform thickness.

The thickness of the resist film can be controlled by adjusting the amount of photoresist applied to the wafer and its viscosity, and the rotational speed of the wafer and the time during which the wafer is rotated.

When a resist film is formed on a nonuniform substrate surface by spin coating (as shown in FIG. 6), the resultant film thickness is not uniform and is greater on the concave portions of the surface (i.e., in the above example, on the bottom surfaces of the channels 38) than on the convex portions (i.e., in the above example, on the top surfaces of the waveguide ridge 40 and the electrode pad platforms 42). However, the amount of change in the thickness of the resist film across the surface depends on the viscosity of the photoresist.

In the case of a laminated semiconductor structure such as that shown in FIG. 6, when the $SiO_2$ film 78 has the same thickness on the bottoms of the channels 38 as on the top of the waveguide ridge 40 and on the tops of the electrode pad platforms 42, if the viscosity of the photoresist is low, the equation b=c+g approximately holds, where: g is the height of the waveguide ridge 40, including the thickness of the resist pattern 76; b is the thickness of the resist film 80 on the channels 38; and c is the thickness of the resist film 80 on the top of the waveguide ridge 40 and on the tops of the electrode pad platforms 42. That is, the top surface of the resist film 80 is substantially uniformly flat.

On the other hand, if the viscosity of the photoresist is high, the resist film 80 may have substantially the same thickness on the channels 38 as on the top of the waveguide ridge 40 and on the tops of the electrode pad platforms 42 (i.e., b=c). (That is, the top surface of the resist film 80 is not uniformly flat and is concavely curved above the channels 38.)

It should be noted that in the wafer shown in FIG. 6 the resist film 80 has a greater thickness on the channels 38 than on the top of the waveguide 40 and on the tops of the electrode pad platforms 42 (i.e., b>c) unless the viscosity of the photoresist is extremely low.

Thus, by suitably adjusting the viscosity of the resist and the rotational speed of the wafer, it is possible to form the resist film 80 such that the inequality b>c holds, where b is the thickness of the resist film 80 on the channels 38 and c is the thickness of the resist film 80 on the top of the waveguide ridge 40 and on the tops of the electrode pad platforms 42. FIG. 6 shows the results of this process step.

Figure 7:
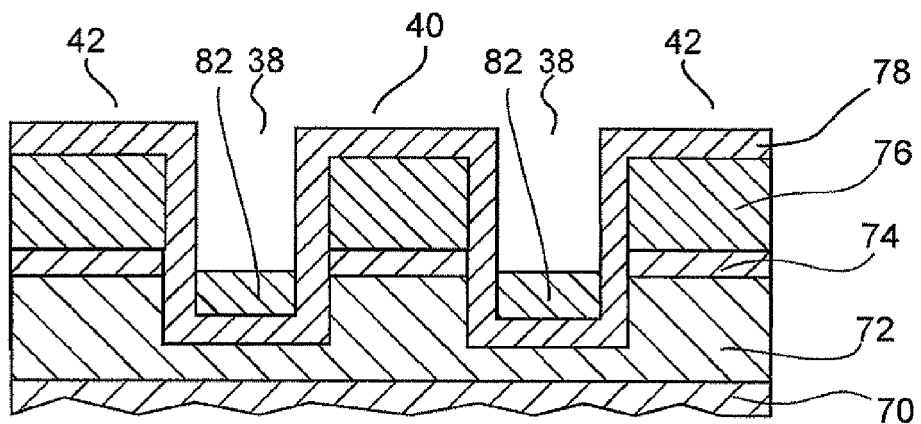

Referring now to FIG. 7, material is uniformly removed from the surface of the resist film 80 (or the resist film 80 is etched back) so that the resist film 80 is completely removed from on top of the waveguide ridge 40 and the electrode pad platforms 42 but left in the channels 38, thereby forming a resist pattern 82 that exposes the $SiO_2$ film 78 on the top surface and sides of the resist pattern 76 and on the sides of the p-GaN layer 74.

This etch-back is done, for example, by O₂ plasma dry etching. According to the present embodiment, the top surface of the resist pattern 82 is substantially level with the lower surface of the p-GaN layer 74.

However, the resist pattern 82 can be of any height (or thickness) that ensures that the resist pattern 82 completely covers the SiO₂ film 78 on the bottoms of the channels 38 and that the top surface of the resist pattern 82 is lower than the top surface of the resist pattern 76 on the waveguide ridge 40. FIG. 7 shows the results of this process step.

Figure 8:
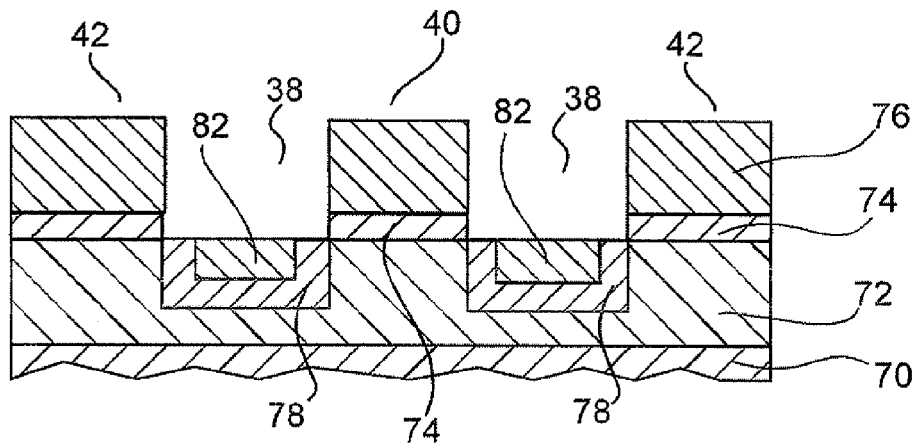

Referring now to FIG. 8, the exposed portions of the SiO₂ film 78 are removed by CF₄ dry etching using the resist pattern 82 as a mask so that the SiO₂ film 78 is completely removed from the top surface and sides of the resist pattern 76 on the top of the waveguide ridge 40 and on the tops of the electrode pad platforms 42 and from the sides of the p-GaN layer 74, but left on the sides and bottoms of the channels 38. (The portions of the SiO₂ film 78 on the sides and bottoms of the channels 38 are covered with the resist pattern 82, as shown in FIG. 8.) That is, this process step completely exposes the resist pattern 76 on the top of the waveguide ridge 40 and on the tops of the electrode pad platforms 42.

According to the present embodiment, the sides of the p-GaN layer 74 are also exposed, as shown in FIG. 8, and the remaining portion of the SiO₂ film 78 has an opening 44a.

It should be noted that, instead of by dry etching, the SiO₂ film 78 may be removed by wet etching in buffered hydrofluoric acid, etc.

When the opening 44a is formed in the SiO₂ film 78 by dry etching as described above, the resist pattern 76 protects the p-GaN layer 74 at the top of the waveguide ridge 40 from etch damage.

It should be noted that damage to the p-GaN layer 74 due to the dry etching process is difficult to remove by wet etching. That is, in the case of the manufacture of an LD formed of GaN based material, it is important to employ some means, such as that herein described, for protecting the top of the waveguide ridge from damage due to dry etching performed to form an opening in the insulating film that covers the waveguide ridge.

According to the present embodiment, as described above, the contact layer 36 (or the p-GaN layer 74) is covered and protected by the resist pattern 76 from etch damage when the SiO₂ film 78 is dry etched, thereby preventing an increase in the contact resistance between the contact layer 36 and the overlying p-side electrode (formed later in the process), resulting in increased yield of the LD 10.

Figure 9:
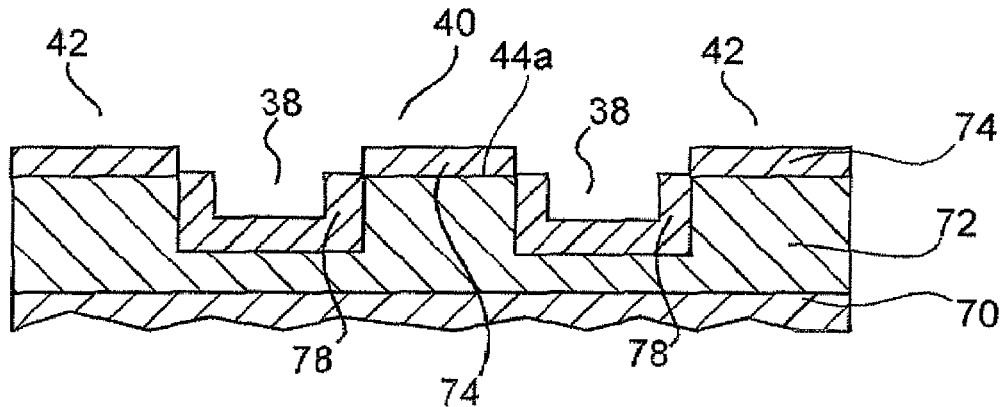

Referring now to FIG. 9, the resist pattern 76 and the resist pattern 82 are removed by wet method using liquid, for example, wet etching in an organic solvent. The use of such an etching method for removing the resist pattern 76 causes substantially no etch damage to the p-GaN layer 74 at the top of the waveguide ridge 40.

It should be noted that, instead of by wet etching in an organic solvent, the resist patterns 76 and 82 may be removed using O₂, or they may be removed by wet etching in a mixed solution of sulfuric acid and hydrogen peroxide solution. FIG. 9 shows the results of this process step.

Figure 10:
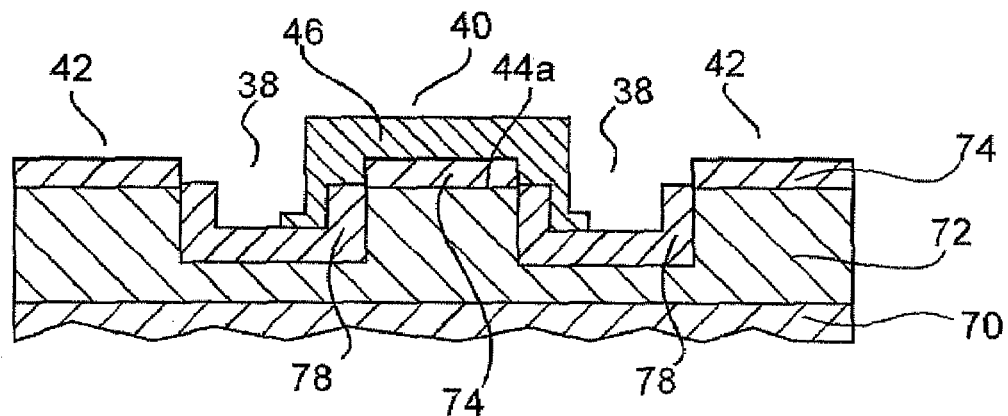

Referring now to FIG. 10, a p-side electrode 46 is formed on the top of the waveguide ridge 40.

More specifically, first, a resist is applied over the entire surface of the wafer and patterned by a photolithography process into a resist pattern (not shown) that exposes the top surface of the p-GaN layer 74 (i.e., the top layer of the waveguide ridge 40), the sidewalls of the waveguide ridge 40, and portions of the bottoms of the channels 38. Next, an electrode layer made up of a laminated structure including gold-gallium (AuGa), gold (Au), platinum (Pt), and Au layers (deposited sequentially) is formed over the resist pattern by, for example, vacuum deposition, and then the resist film (or pattern) and the overlying portion of the electrode layer are removed by lift-off to form the p-side electrode 46.

Thus, the top surface of the p-GaN layer 74 at the top of the waveguide ridge 40 is not covered with the SiO₂ film 78 and is entirely exposed through the opening 44a (when the electrode layer is formed), preventing a reduction in the contact area and hence an increase in the contact resistance between the p-side electrode 46 and the p-GaN layer 74.

Since the top edges of the SiO₂ film 78 that covers the sides of the channels 38 are substantially level with the lower surface of the p-GaN layer 74, p-side electrode 46 closely covers both the top surface and sides of the p-GaN layer 74, resulting in an increase in the contact area and hence a reduction in the contact resistance between the p-side electrode 46 and the p-GaN layer 74, as shown in FIG. 10.

Next, a second silicon oxide film 48 is formed.

Figure 11:
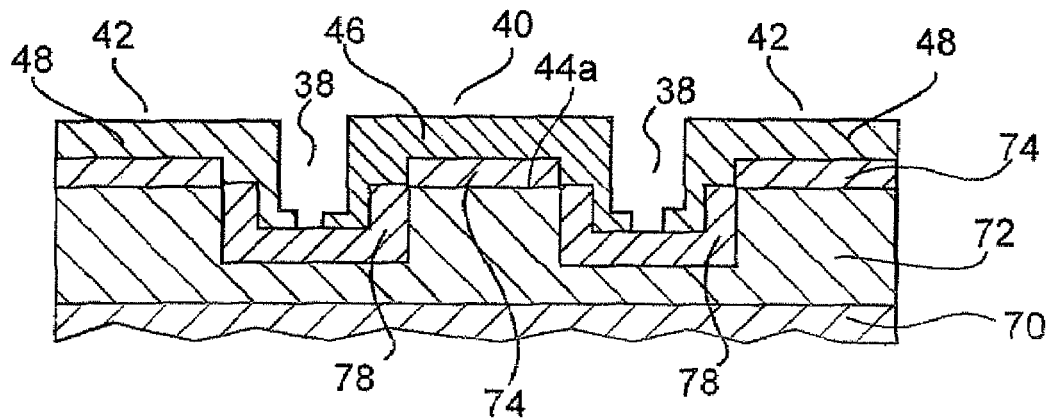

Specifically, referring to FIG. 11, first a resist is applied over the entire surface of the wafer and patterned by a photolithography process into a resist pattern (not shown) that exposes the surface of the wafer except for the surface of the p-side electrode 46 (that is, exposes the top surfaces of the electrode pad platforms 42, the sides of the electrode pad platforms 42 within the channels 38, and portions of the bottoms of the channels 38). An SiO₂ film is then formed over the entire surface of the wafer by vapor deposition to a thickness of 100 nm, and the resist film on the p-side electrode 46 and the portion of the SiO₂ film on the resist film are removed by lift-off to form a second silicon oxide film 48 (made up of the remaining portions of the SiO₂ film). FIG. 11 shows the results of this process step.

It should be noted that instead of the SiO₂ film, one of the following insulating films may be formed: $SiO_x$ (0<x<2), SiN, SiON, TiO₂, Ta₂O₅, Al₂O₃, AlN, ZrO₂, and Nb₂O₅ films.

Figure 12:
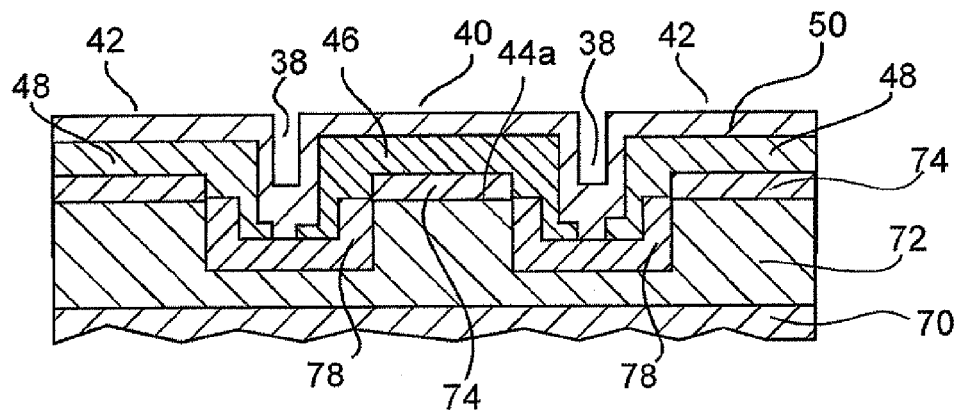

Lastly, referring now to FIG. 12, a metal film of Ti, Pt, and Au is formed over the p-side electrode 46, the channels 38, and the second silicon oxide film 48 by vacuum deposition to form a pad electrode 50.

Variation 1

Figure 13:
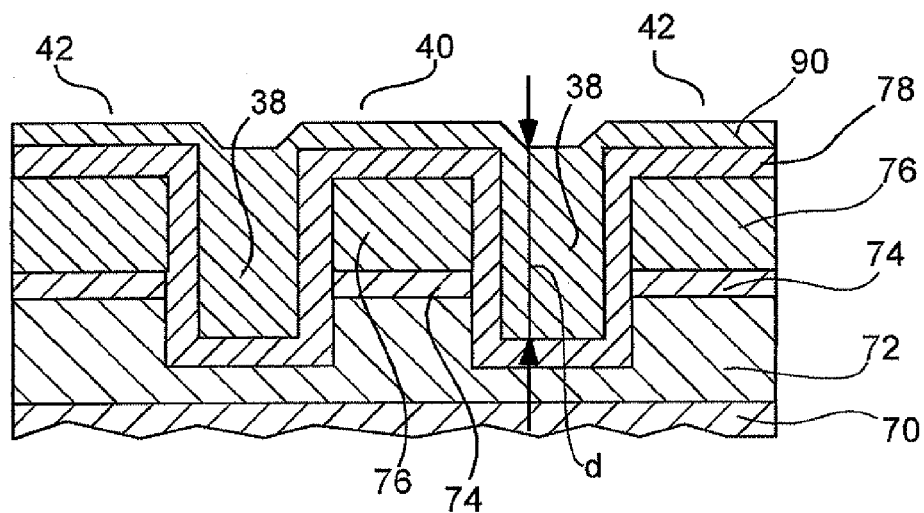
FIGS. 13 to 15 are partial cross-sectional views illustrating process steps in another method for manufacturing an LD according to the present invention.
Figure 14:
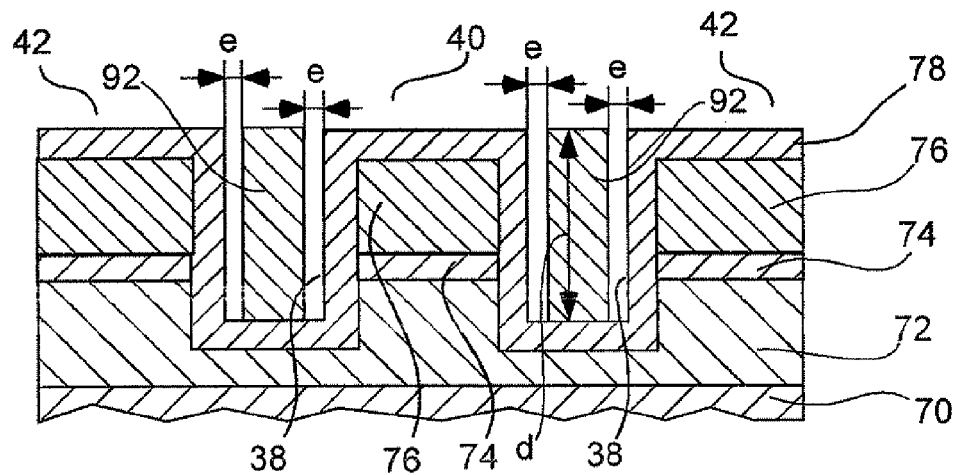
Figure 15:
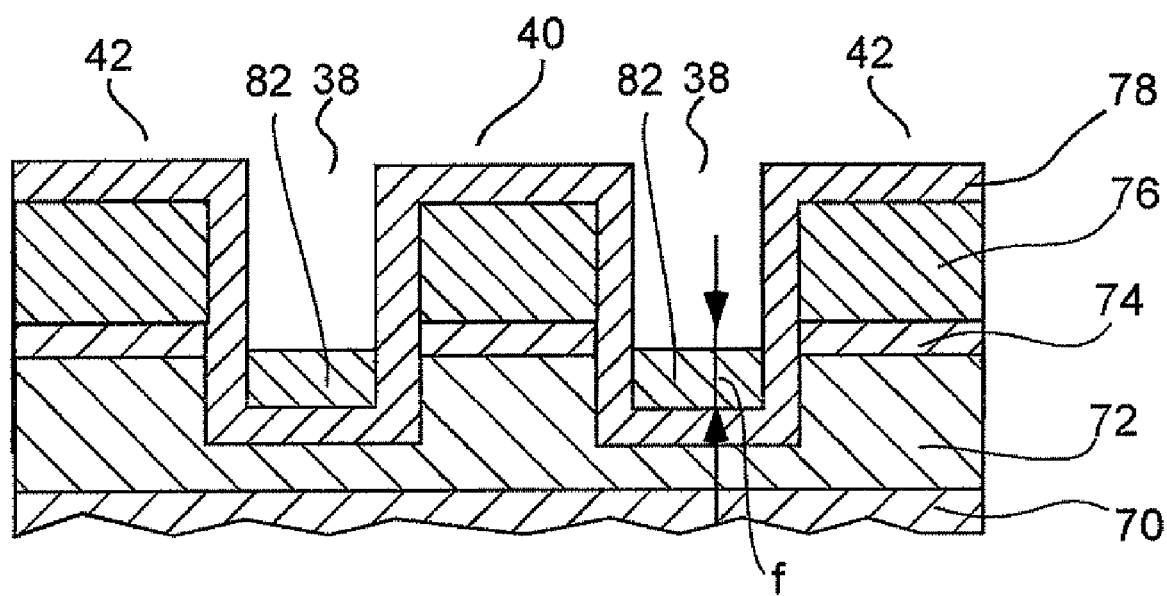

FIGS. 13 to 15 are partial cross-sectional views illustrating process steps in another method for manufacturing an LD according to the present invention.

The steps shown in FIGS. 1 to 5 in above first embodiment are the same as those steps in this variation. However, this manufacturing method includes the steps shown in FIGS. 13 to 15 instead of those shown in FIGS. 6 and 7.

In the step shown in FIG. 5, the SiO₂ film 78 is formed to cover the top surface and sides of the remaining used resist pattern 76 on the top of the waveguide 40 and on the tops of the electrode pad platforms 42 and also cover the bottom and inner sides of the channels 38, as described above. In the subsequent step shown in FIG. 13, a photoresist predominantly composed of a thermoplastic resin such as a novolac resin is applied over the entire surface of the wafer to form a resist film 90 such that the top surfaces of the resist film 90 on the channels 38 adjacent the waveguide ridge 40 are substantially level with the top surface of the SiO₂ film 78 on the top of the waveguide ridge 40.

According to the present embodiment, the thickness d of the resist film 90 on the channels 38, that is, the height from the top surfaces of the SiO₂ film 78 on the bottoms of the channels 38 to the top surface of the resist film 90, is approximately 500 nm (0.5 μm) plus the thickness of the resist pattern 76.

In this case, the thickness d of the resist film 90 on the channels 38 can be accurately controlled to the desired value by suitably adjusting the viscosity of the resist and the rotational speed of the wafer, as in the case of the formation of the resist film 80 described with reference to FIG. 6. FIG. 13 shows the results of this process step.

Referring now to FIG. 14, the resist film 90 is then removed by a photolithography process except on portions of the SiO₂ film 78 on the bottoms of the channels 38 to entirely expose the top surfaces of the SiO₂ film 78 on the top of the waveguide ridge 40 and on the tops of the electrode pad platforms 42, thereby forming a resist pattern 92. (The remaining portions of the resist film 90, which form the resist pattern 92, are spaced a predetermined distance e from the SiO₂ film 78 on the sidewalls of the waveguide ridge 40 and on the sidewalls of the electrode pad platforms 42 within the channels 38, and exposes the top surfaces of the SiO₂ film 78 on the top of the waveguide ridge 40 and on the tops of the electrode pad platforms 42 as shown in FIG. 14.)

Referring now to FIG. 15, the wafer with the laminated semiconductor structure having the resist pattern 92 thereon is then heat treated, for example, at 140° C. in the atmosphere for 10 minutes to soften or plasticize the resist pattern 92. As a result, material of the resist pattern 92 (or resist film) flows to fill the above gaps e between the resist pattern 92 and the SiO₂ film 78 on the sidewalls of the waveguide ridge 40 and on the sidewalls of the electrode pad platforms 42. That is, the resist material flows and comes into close contact with the SiO₂ film 78 on these sidewalls, with the result that the height of the top surface of the resist pattern 92 (or resist film) is reduced. FIG. 15 shows the resultant resist pattern 82, which is left within the channels 38 and exposes the SiO₂ film 78 on the top surface and sides of the resist pattern 76 and on the sides of the p-GaN layer 74. That is, this resist pattern 82 is similar to that shown in FIG. 7.

The top surface of the resist pattern 82 within the channels 38 is substantially level with the lower surface of the p-GaN layer 74, as in the case of the structure shown in FIG. 7. (The height of the resist pattern 82 is indicated by f in FIG. 15.)

To achieve this, the gaps e are formed to have a size that allows the resist pattern 82 (within the channels 38) to eventually have the desired height f (which may be calculated by assuming that the volume of the resist pattern does not change between the process steps shown in FIGS. 14 and 15 and hence the cross-sectional area of the resist pattern 82 is equal to that of the resist pattern 92).

It should be noted that although in FIG. 14 a gap e is provided on each side of the resist pattern 92 within each channel 38, it may be provided only on one side of the resist pattern 92 if this still allows the resist pattern 82 to have the desired height f.

The subsequent steps are the same as those shown in FIGS. 8 to 12 described above.

Thus, the above methods of the present embodiment for manufacturing an LD 10 proceed substantially as follows. A resist is applied over the entire surface of a laminated semiconductor structure formed on an n-GaN substrate 12 and is patterned to form a resist pattern 76 having a stripe shape corresponding to a waveguide ridge. Next, dry etching is performed using the resist pattern 76 as a mask to form channels 38 and the waveguide ridge 40 which has a p-GaN layer 74 at the top. An SiO₂ film 78 is then formed over the wafer, with the used resist pattern 76 still on the top surface of the waveguide ridge 40. (The SiO₂ film 78 covers the top surface and sides of the resist pattern 76 on the top of the waveguide 40 and also covers the bottom and inner sides of the channels 38.) A resist pattern 82 is then formed which exposes the SiO₂ film 78 on the top of the waveguide ridge 40 and which covers the SiO₂ film 78 within the channels 38 and whose top surface is substantially level with the lower surface of the p-GaN layer 74. Next, the exposed portions of SiO₂ film 78 are removed by dry etching using the resist pattern 82 as a mask to expose the resist pattern 76 on the top surface of the waveguide ridge 40. (That is, the remaining portion of the SiO₂ film 78 has an opening 44a that exposes the resist pattern 76 on the top of the waveguide ridge 40.) The exposed resist pattern 76 on the top of the waveguide ridge 40 and the resist pattern 82 are then removed by wet etching in an organic solvent, and a p-side electrode 46 is formed on the p-GaN layer 74 at the top of the waveguide ridge 40.

According to these LD manufacturing methods, the p-side electrode 46 is formed on and in contact with the top surface of a semiconductor layer (namely, the p-GaN layer 74, which will become the contact layer 36) after making sure that the top surface is not covered with the SiO₂ film 78 and is entirely exposed through the opening 44a, which avoids a reduction in the contact area between the p-side electrode 46 and the contact layer 36 and prevents an increase in the operating voltage.

Further, even if the opening 44a is formed in the SiO₂ film 78 by dry etching, the resist pattern 76 that covers the top surface of the p-GaN layer 74 protects the p-GaN layer 74 from damage due to such etching, thereby preventing an increase in the contact resistance between the p-GaN layer 74 (or contact layer 36) and the overlying p-side electrode layer 46 formed later in the process and preventing an increase in the operating voltage.

Thus, according to the methods of the present embodiment, it is possible to manufacture an LD 10 having good characteristics with a high yield by employing a simple process.

As described above, the present invention provides a method for manufacturing a semiconductor optical device comprising: forming, in a photolithography process, a first resist pattern of a resist film disposed on a top surface of a laminated semiconductor structure including a first semiconductor layer of a first conductivity type, an active layer, and a second semiconductor layer of a second conductivity type, in sequence, on a substrate, the first resist pattern having a portion shaped in correspondence to a waveguide ridge; removing upper portions of the second semiconductor layer by dry etching, using the first resist pattern as a mask, to form the waveguide ridge and concave portions adjacent to the waveguide ridge, concave portions leaving lower portions of the second semiconductor layer; forming a first insulating film on the waveguide ridge and on the concave portions, leaving the first resist pattern still on a top surface of the waveguide ridge; forming a second resist pattern covering the first insulating film in the concave portions, and exposing a top surface of the first insulating film on top of the waveguide ridge, the second resist pattern having a top surface closer to the substrate than a top surface of the first resist pattern on the waveguide ridge or leveling with a top surface of the first resist pattern on the waveguide ridge; removing the first insulating film by etching, using the second resist pattern as a mask, to expose a top surface of the first resist pattern leaving on the waveguide ridge; removing the first resist pattern on top of the waveguide ridge and the second resist pattern; and forming an electrode layer on the top surface of the second semiconductor layer in the waveguide ridge.

Thus, the method of the present invention for manufacturing a semiconductor optical device includes: forming a first insulating film on the waveguide ridge leaving the first resist pattern still on a top surface of the waveguide ridge; removing the first insulating film by etching, using the second resist pattern as a mask, to expose a top surface of the first resist pattern leaving on the waveguide ridge; removing the first resist pattern on top of the waveguide ridge and the second resist pattern.

This arrangement allows the electrode layer to be formed on and in full contact with the second semiconductor layer while avoiding a reduction in the contact area between them.

Further, even if the first insulating film is removed by dry etching, the first resist pattern that covers the top surface of the waveguide ridge protects the surface of the second semiconductor layer from damage due to such etching, thereby preventing an increase in the contact resistance between the second semiconductor layer and the electrode layer formed later in the process. As a result, it is possible to manufacture a semiconductor optical device having good characteristics with a high yield by employing a simple process.

Thus, the above methods of the present invention are suitable for manufacturing a semiconductor optical device in which the waveguide ridge has an electrode on its top.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device comprising:
    forming, in a photolithography process, a first resist pattern of a resist film disposed on a top surface of a laminated semiconductor structure including a first semiconductor layer of a first conductivity type, an active layer, and a second semiconductor layer of a second conductivity type, in sequence, on a substrate, the first resist pattern having a portion shaped in correspondence to a waveguide ridge;
    removing portions of the second semiconductor layer by dry etching, using the first resist pattern as a mask, to form the waveguide ridge and concave portions adjacent to the waveguide ridge, with portions of the second semiconductor layer remaining as the concave portions;
    forming a first insulating film on the waveguide ridge and on the concave portions, leaving the first resist pattern in place on a top surface of the waveguide ridge;
    forming a second resist pattern covering the first insulating film in the concave portions, and exposing a top surface of the first insulating film on top of the waveguide ridge, the second resist pattern having a top surface closer to the substrate than a top surface of the first resist pattern on the waveguide ridge or level with a top surface of the first resist pattern on the waveguide ridge;
    removing the first insulating film by etching, using the second resist pattern as a mask, to expose a top surface of the first resist pattern on the waveguide ridge;
    removing the first resist pattern on top of the waveguide ridge and the second resist pattern; and
    forming an electrode layer on the top surface of the second semiconductor layer in the waveguide ridge.

2. The method for manufacturing a semiconductor optical device according to claim 1, including removing the first insulating film by dry etching.

3. The method for manufacturing a semiconductor optical device according to claim 1, including removing the first resist pattern from on top of the waveguide ridge and removing the second resist pattern by a wet method.

4. The method for manufacturing a semiconductor optical device according to claim 1, wherein forming the second resist pattern includes:
    forming a second resist film over the first insulating film, the second resist film having a larger thickness on the concave portions than on top of the waveguide ridge, and
    uniformly removing material from a top surface of the second resist film to expose the first insulating film on top of the waveguide ridge, leaving the second resist film in the concave portions.

* * * * *